US012642152B2

(12) United States Patent
Arens et al.

(10) Patent No.: US 12,642,152 B2
(45) Date of Patent: May 26, 2026

(54) POWER SEMICONDUCTOR MODULE ARRANGEMENT AND METHOD FOR PRODUCING A POWER SEMICONDUCTOR MODULE ARRANGEMENT

(71) Applicant: Infineon Technologies AG, Neubiberg (DE)

(72) Inventors: Andre Arens, Rüthen (DE); Jens de Bock, Wadersloh (DE); Xi Zhang, Erwitte (DE); Dietmar Spitzer, Völkermarkt (AT)

(73) Assignee: Infineon Technologies AG, Neubiberg (DE)

( * ) Notice: Subject to any disclaimer, the term of this patent is extended or adjusted under 35 U.S.C. 154(b) by 403 days.

(21) Appl. No.: 18/314,459

(22) Filed: May 9, 2023

(65) Prior Publication Data

US 2023/0369187 A1 Nov. 16, 2023

(30) Foreign Application Priority Data

May 16, 2022 (EP) ..................................... 22173416

(51) Int. Cl.
*H01L 23/31* (2006.01)
*H01L 21/56* (2006.01)
(Continued)

(52) U.S. Cl.
CPC ........ *H01L 23/49811* (2013.01); *H01L 21/56* (2013.01); *H01L 23/3121* (2013.01);
(Continued)

(58) Field of Classification Search
CPC ............... H01L 23/49811; H01L 21/56; H01L 23/3121; H01L 23/49838; H01L 25/072;
(Continued)

(56) References Cited

U.S. PATENT DOCUMENTS

| | | | |
|---|---|---|---|
| 6,819,095 | B1 | 11/2004 | Dubhashi et al. |
| 2002/0190325 | A1 | 12/2002 | Mochizuki |

(Continued)

FOREIGN PATENT DOCUMENTS

| | | |
|---|---|---|
| WO | 2021151949 A1 | 8/2021 |

*Primary Examiner* — Elias Ullah
(74) *Attorney, Agent, or Firm* — Murphy, Bilak & Homiller, PLLC

(57) ABSTRACT

A power semiconductor module arrangement includes: a housing; a substrate having a substrate layer and a first metallization layer on a first side of the substrate layer, inside the housing or forming a bottom of the housing; a printed circuit board inside the housing, vertically above and in parallel to the substrate; electrically conducting components on the printed circuit board and substrate; an encapsulant at least partly filling the interior of the housing; and a magnetic field sensor either on the substrate within range of a magnetic field caused by a current flowing through one of the electrically conducting components arranged on the printed circuit board, or on the printed circuit board within range of a magnetic field caused by a current flowing through one of the electrically conducting components arranged on the substrate. The magnetic field sensor is electrically insulated from the respective electrically conducting component.

12 Claims, 5 Drawing Sheets

(51) Int. Cl.

| | | |
|---|---|---|
| *H01L 23/498* | (2006.01) | |
| *H01L 25/07* | (2006.01) | |
| *H05K 1/02* | (2006.01) | |
| *H05K 1/181* | (2026.01) | |

(52) U.S. Cl.
CPC ...... *H01L 23/49838* (2013.01); *H01L 25/072* (2013.01); *H05K 1/0213* (2013.01); *H05K 1/181* (2013.01); *H05K 2201/083* (2013.01); *H05K 2201/10151* (2013.01)

(58) Field of Classification Search
CPC ..... H01L 23/3735; H01L 23/62; H01L 24/29; H01L 24/32; H01L 24/40; H01L 24/48; H01L 24/49; H01L 24/73; H01L 24/83; H01L 24/92; H01L 2224/29101; H01L 2224/29339; H01L 2224/32225; H01L 2224/40225; H01L 2224/45014; H01L 2224/48091; H01L 2224/48227; H01L 2224/48472; H01L 2224/49113; H01L 2224/73265; H01L 2224/83801; H01L 2224/8384; H01L 2224/92247; H01L 2924/00014; H01L 2924/181; H01L 25/162; H01L 21/52; H01L 22/34; H05K 1/0213; H05K 1/181; H05K 2201/083; H05K 2201/10151; H05K 1/02; H05K 5/0217; G01R 31/2818; G01R 15/207; G01R 1/04; G01R 19/00

See application file for complete search history.

(56) References Cited

U.S. PATENT DOCUMENTS

| | | |
|---|---|---|
| 2006/0038552 A1 | 2/2006 | Omura et al. |
| 2014/0327436 A1 | 11/2014 | Castro Serrato |
| 2022/0137100 A1* | 5/2022 | Barbut ................. G01R 15/202 |
| | | 324/251 |

* cited by examiner

POWER SEMICONDUCTOR MODULE ARRANGEMENT AND METHOD FOR PRODUCING A POWER SEMICONDUCTOR MODULE ARRANGEMENT

TECHNICAL FIELD

The instant disclosure relates to a power semiconductor module arrangement, and to a method for producing a power semiconductor arrangement.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate.

Some power semiconductor module arrangements also include a printed circuit board arranged distant from and in parallel to the substrate. The printed circuit board may also be arranged inside the housing. A plurality of different electrical or electrically conducting components (e.g., semiconductor elements, terminal elements, connection elements, etc.) may be arranged on the substrate and/or on the printed circuit board. For some applications, it may be advantageous or even required to monitor one or more currents in the power semiconductor module arrangement. Corresponding current measurement arrangements are often large, generate a significant amount of heat and are expensive to realize.

There is a need for a current measurement arrangement in a power semiconductor module arrangement which overcomes the above drawbacks.

SUMMARY

A power semiconductor module arrangement includes, a housing, a substrate comprising a substrate layer and a first metallization layer deposited on a first side of the substrate layer, and arranged inside the housing or forming a bottom of the housing, a printed circuit board arranged inside the housing, vertically above and in parallel to the substrate, a plurality of electrically conducting components arranged on the printed circuit board and on the substrate, an encapsulant at least partly filling the interior of the housing, thereby covering the substrate, and a magnetic field sensor configured to detect the strength of a magnetic field, wherein either the magnetic field sensor is arranged on the substrate within the range of a magnetic field caused by a current flowing through one of the electrically conducting components arranged on the printed circuit board, or the magnetic field sensor is arranged on the printed circuit board within the range of a magnetic field caused by a current flowing through one of the electrically conducting components arranged on the substrate, the magnetic field sensor is electrically insulated from the respective electrically conducting component, and the power semiconductor module arrangement further includes evaluation means configured to determine the current flowing through the electrically conducting component based on the strength of the magnetic field detected by the magnetic field sensor.

A method includes arranging a substrate with a plurality of electronic or electrically conducting components arranged thereon in a housing or as a bottom of a housing, wherein the housing includes sidewalls, arranging a printed circuit board with a plurality of electronic or electrically conducting components arranged thereon in the housing, vertically above and in parallel to the substrate, and forming an encapsulant at least partly filling the interior of the housing, thereby covering the substrate, wherein either a magnetic field sensor is arranged on the substrate within the range of a magnetic field caused by a current flowing through one of the electrically conducting components arranged on the printed circuit board, or a magnetic field sensor is arranged on the printed circuit board within the range of a magnetic field caused by a current flowing through one of the electrically conducting components arranged on the substrate, the magnetic field sensor is electrically insulated from the respective electrically conducting component, and the method further includes arranging evaluation means on the substrate or on the printed circuit board, the evaluation means being configured to determine the current flowing through the electrically conducting component based on the strength of the magnetic field detected by the magnetic field sensor.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
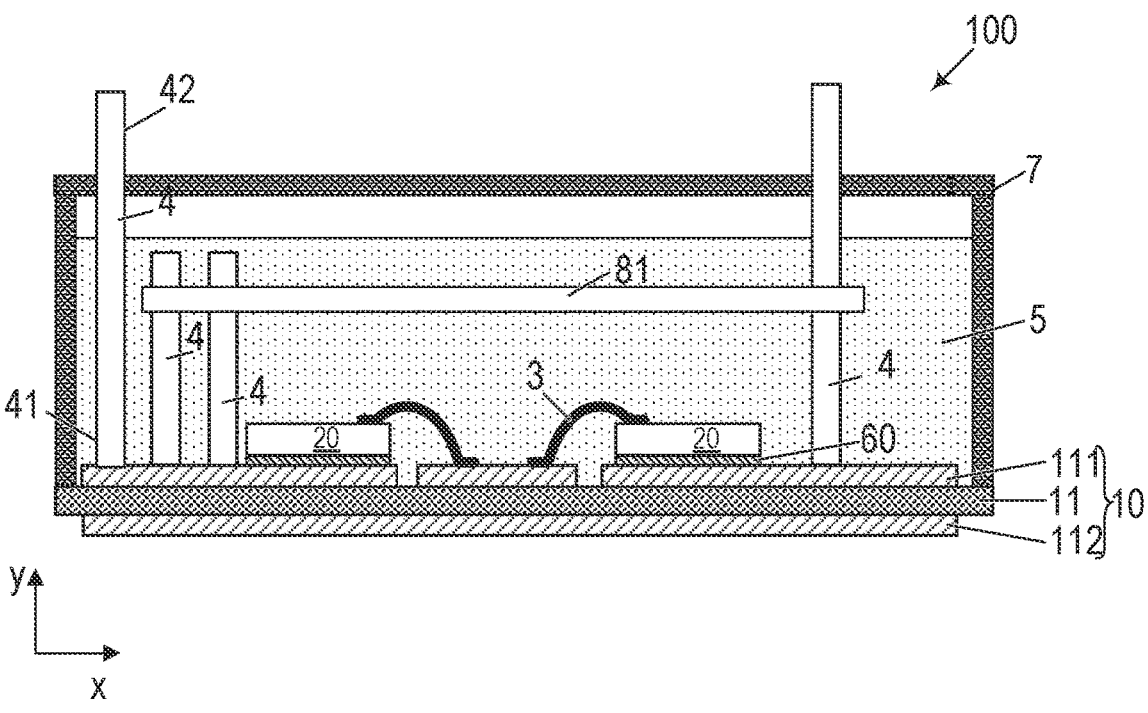
FIG. 1 is a cross-sectional view of a power semiconductor module arrangement.

Referring to FIG. 1, a cross-sectional view of a power semiconductor module arrangement 100 is schematically illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An IMS generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, or BN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 forms a ground surface of the housing 7, while the housing 7 itself solely comprises sidewalls and a cover or lid. This is, however, only an example. It is also possible that the substrate 10 is arranged on a base plate which forms a ground surface of the housing 7, or that the housing 7 further comprises a ground surface and the substrate 10 and, optionally, the base plate be arranged inside the housing 7. In some power semiconductor module arrangements 100, more than one substrate 10 is arranged on a single base plate 12 or on the ground surface of a housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 20 may be mounted to the same or to different sections of the first metallization layer 111. Different sections of the first metallization layer 111 may have no electrical connection or may be electrically connected to one or more other sections using electrical connections 3 such as, e.g., bonding wires. Electrical connections 3 may also include bonding ribbons, connection plates or conductor rails, for example, to name just a few examples. The one or more semiconductor bodies 20 may be electrically and mechanically connected to the substrate 10 by an electrically conductive connection layer 60. Such an electrically conductive connection layer 60 may be a solder layer, a layer of an electrically conductive adhesive, or a layer of a sintered metal powder, e.g., a sintered silver powder, for example.

According to other examples, it is also possible that the second metallization layer 112 is a structured layer. It is further possible to omit the second metallization layer 112 altogether. It is generally also possible that the first metallization layer 111 is a continuous layer, for example.

The power semiconductor module arrangement 100 illustrated in FIG. 1 further includes terminal elements 4. A first subset of the terminal elements 4 is electrically connected to the first metallization layer 111 and provides an electrical connection between the inside and the outside of the housing 7. The terminal elements 4 may be electrically connected to the first metallization layer 111 with a first end 41, while a second end 42 of each of the terminal elements 4 protrudes out of the housing 7. The terminal elements 4 may be electrically contacted from the outside at their respective second ends 42. A first part of the terminal elements 4 may extend through the inside of the housing 7 in a vertical direction y. The vertical direction y is a direction perpendicular to a top surface of the substrate 10, wherein the top surface of the substrate 10 is a surface on which the at least one semiconductor body 20 is mounted. The terminal elements 4 illustrated in FIG. 1, however, are only examples. Terminal elements 4 may be implemented in any other way and may be arranged anywhere within the housing 7. For example, one or more terminal elements 4 may be arranged further away from the sidewalls of the housing 7. Terminal elements 4 could also protrude through the sidewalls of the housing 7 instead of through the cover. The first end 41 of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end 41 of a terminal element 4 may also be electrically coupled to the substrate 10 via one or more electrical connections 3, for example. For example, the second ends 42 of the terminal elements 4 may be connected to a printed circuit board that is arranged outside of the housing 7 (external printed circuit board not illustrated in FIG. 1).

The power semiconductor module arrangement 100 further comprises an internal printed circuit board 81. The printed circuit board 81 is coupled to a second subset of terminal elements 4 and is arranged inside the housing 7. The second subset of the terminal elements 4 may comprise shorter terminal elements that are arranged entirely inside the housing 7. A third subset of terminal elements 4, however, may extend from the substrate 10 through a through hole in the printed circuit board 81 to the outside of the housing 7, which is exemplarily illustrated for one of the terminal elements 4 of FIG. 1.

According to another example that is not specifically illustrated, one or more terminal elements 4 may be mechanically and electrically coupled to the printed circuit board 81 with their first ends 41, while their second ends 42 extend to the outside of the housing 7. By arranging a printed circuit board 81 inside the housing 7, the power semiconductor module arrangement 100 can be implemented in a compact and space saving way, for example. This is, because at least a subset of a plurality of components that is usually arranged on the substrate 10 or on an external printed circuit board (printed circuit board that is arranged outside of the housing 7) can be arranged on the internal printed circuit board 81 instead of on the substrate 10 or an external printed circuit board. That is, some (or all) components can be arranged on the printed circuit board 81 inside the housing 7, while others (or none) are arranged on an (optional) external printed circuit board. The size of the substrate 10 and/or an external printed circuit board, therefore, can be reduced as compared to arrangements only comprising a substrate 10, or a substrate 10 and an external printed circuit board outside the housing 7 but not the printed circuit board 81 inside the housing 7.

The power semiconductor module arrangement 100 further includes an encapsulant 5. The encapsulant 5 may consist of or include a silicone gel or may be a rigid molding compound, for example. The encapsulant 5 may at least partly fill the interior of the housing 7, thereby covering the components and electrical connections that are arranged on the substrate 10. In order to protect the printed circuit board 81 inside the housing 7 and the components arranged on the printed circuit board 81 from certain environmental conditions and mechanical damage, the printed circuit board 81, optionally, may also be covered by the encapsulant 5. The terminal elements 4 may be at least partly embedded in the encapsulant 5. At least the second ends 42 of the first subset and the third subset, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged on the substrate 10 inside the housing 7, from certain environmental conditions and mechanical damage.

For some applications it may be advantageous or even required to monitor one or more currents in the power semiconductor module arrangement 100. The power semiconductor module arrangement 100 illustrated in FIG. 2, therefore, further includes a magnetic field sensor 900. The magnetic field sensor 900 is configured to detect the strength of a magnetic field. In the example illustrated in FIG. 2, the magnetic field sensor 900 is arranged on the printed circuit board 81 within the range of a magnetic field caused by a current flowing through an electrically conducting component 910, wherein the electrically conducting component 910 is arranged on the substrate 10. In this way, a current through the electrically conducting component 910 can be monitored contactless. The magnetic field sensor 900 is galvanically insulated from the respective electrically conducting component 910. Galvanic isolation is established by arranging the magnetic field sensor 900 at a defined distance d1 from the electrically conducting component 910 and further by means of the encapsulant 5 which fills the resulting area between the magnetic field sensor 900 and the electrically conducting component 910.

Figure 2:
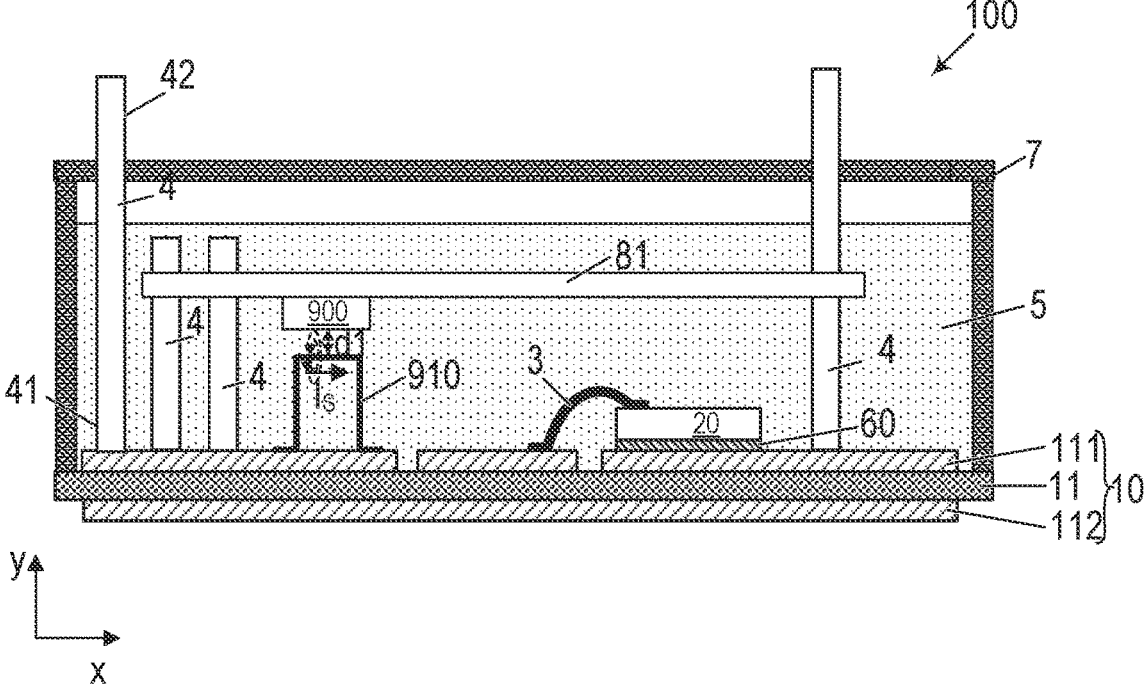
FIG. 2 is a cross-sectional view of a power semiconductor module arrangement according to one example.

In the example illustrated in FIG. 2, the magnetic field sensor 900 is arranged on a side of the printed circuit board 81 which faces the substrate 10. In this way, the magnetic field caused by a current flowing through the electrically conducting component is not influenced by any components (e.g., the printed circuit board 81) arranged between the magnetic field sensor 900 end the electrically conducting component 910. This, however, is not mandatory. It is generally also possible that the magnetic field sensor 900 be arranged on a side of the printed circuit board 81 which faces away from the substrate 10. If the magnetic field is strong enough, it may still be reliably detected.

The power semiconductor module arrangement 100 further comprises evaluation means configured to determine the current flowing through the electrically conducting component 910 based on the strength of the magnetic field detected by the magnetic field sensor 900. Such evaluation means may either be included in the magnetic field sensor 900 itself, or may be arranged on the printed circuit board 81 or on the substrate 10, for example.

While in the example illustrated in FIG. 2, the magnetic field sensor 900 is arranged on the printed circuit board 81 and the electrically conducting component 910 is arranged on the substrate 10, it is also possible, for example, that the magnetic field sensor 900 is arranged on the substrate 10 within the range of a magnetic field caused by a current flowing through an electrically conducting component 910 arranged on the printed circuit board 81. The same general principles apply for both cases.

In the example illustrated in FIG. 2, the electrically conducting component 910 is a dedicated component that has no other function than conducting a current which causes a magnetic field to be detected by the magnetic field sensor 900. Examples of such dedicated electrically conducting components will be described in further detail below. It is, however, also possible that electrically conducting components that are already present in the power semiconductor module arrangement 100 for other reasons are used for the purpose of measuring a current in the power semiconductor module arrangement 100. Any electrically conducting component which actually conducts a current during the use of the power semiconductor module arrangement 100 causes a magnetic field which can be detected by means of a magnetic field sensor 900.

Figures 8, 9, 10:
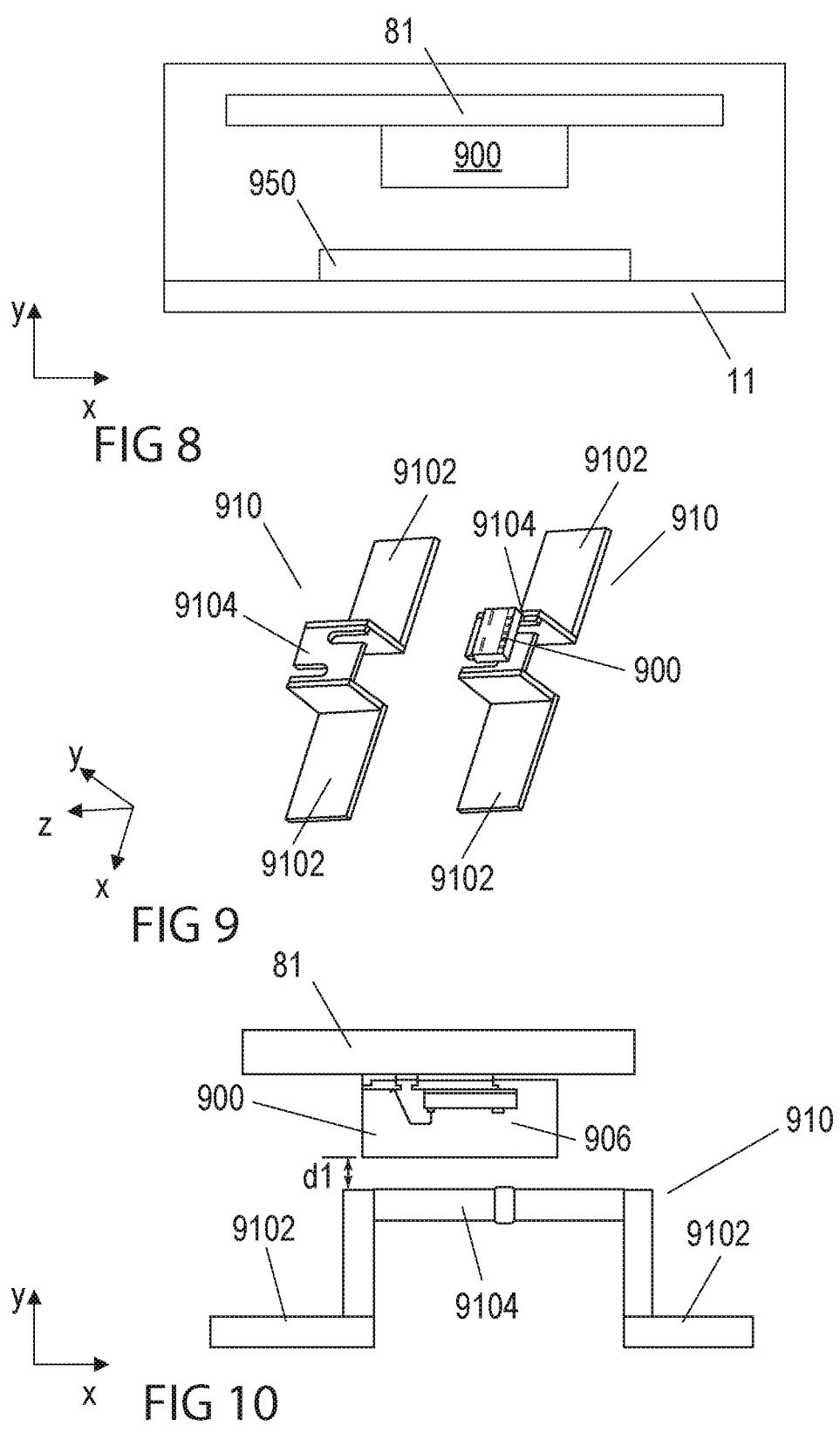
FIG. 8 is a cross-sectional view of a power semiconductor module arrangement according to an even further example.
FIG. 9 schematically illustrates three-dimensional views of a metal bracket of a current measurement arrangement according to one example.
FIG. 10 schematically illustrates a cross-sectional view of a current measurement arrangement according to another example.

Summarizing the above and with reference to FIG. 8, an electrically conducting component 950 may include either a dedicated electrically conducting component 910, or an electrically conducting component such as, e.g., a terminal element 4, a bonding wire 3, a bonding ribbon, a connection plate, a conductor rail, a section of the first metallization layer 111 of the substrate 10, or a conducting path formed on the printed circuit board 81, which actually conduct a current during the use of the power semiconductor module arrangement 100 and cause a magnetic field which can be detected by means of a magnetic field sensor 900. The magnetic field caused by the current flowing through the electrically conducting component is detected by a magnetic field sensor 900 that is arranged within the range of the magnetic field. The magnetic field sensor 900 is electrically insulated from the respective electrically conducting component 950 by means of the distance between them and the encapsulant 5.

Figure 3:
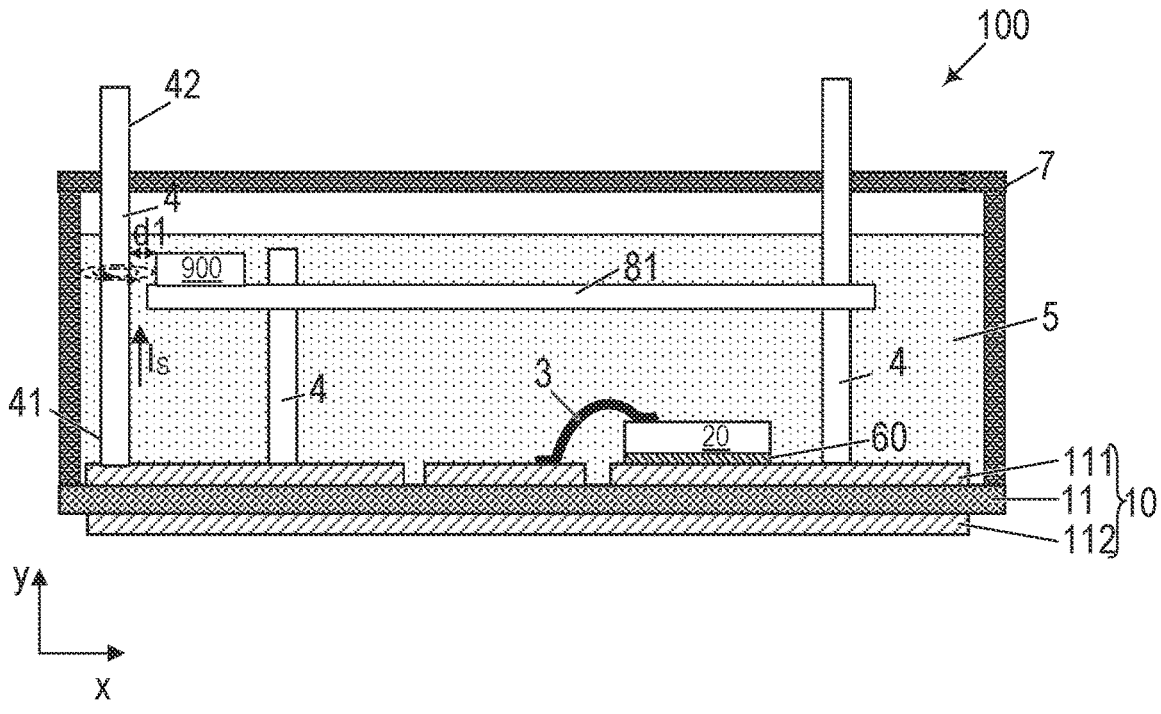
FIG. 3 is a cross-sectional view of a power semiconductor module arrangement according to another example.

Now referring to FIG. 3, the electrically conducting component may comprise one or more terminal elements 4, as have been described with respect to FIG. 1 above. In the example illustrated in FIG. 3, the one or more terminal elements 4 are terminal elements of the first subset which extend from the substrate 10 through the inside of the housing 7 to the outside of the housing 7. In the example illustrated in FIG. 3, the one or more terminal elements 4 extend past the printed circuit board 81 in a horizontal direction x. That is, the one or more terminal elements 4 are not in direct contact with the printed circuit board 81. This, however, is only an example. It is generally also possible that the one or more terminal elements 4 are terminal elements of the second or third subset, as has been described with respect to FIG. 1 above.

The magnetic field sensor 900 in the example illustrated in FIG. 3 is arranged on the printed circuit board 81 and within the magnetic field caused by the current $I_S$ through the one or more terminal elements 4. That is, the magnetic field sensor 900 may be arranged close to an edge of the printed circuit board 81 which is arranged in close proximity to the one or more terminal elements 4. In close proximity in this context means any distance which provides sufficient electrical isolation between the one or more terminal elements 4 and the magnetic field sensor 900, while still allowing the magnetic field caused by the current $I_S$ flowing through the one or more terminal elements 4 to be sensed by the magnetic field sensor 900. The magnetic field sensor 900 may comprise a TMR sensor or a Hall sensor, for example, which is able to detect the magnetic field. The current $I_S$ through the one or more terminal elements 4 may then be determined based on the strength of the detected magnetic field by means of respective evaluation means.

Figures 5, 6, 7:
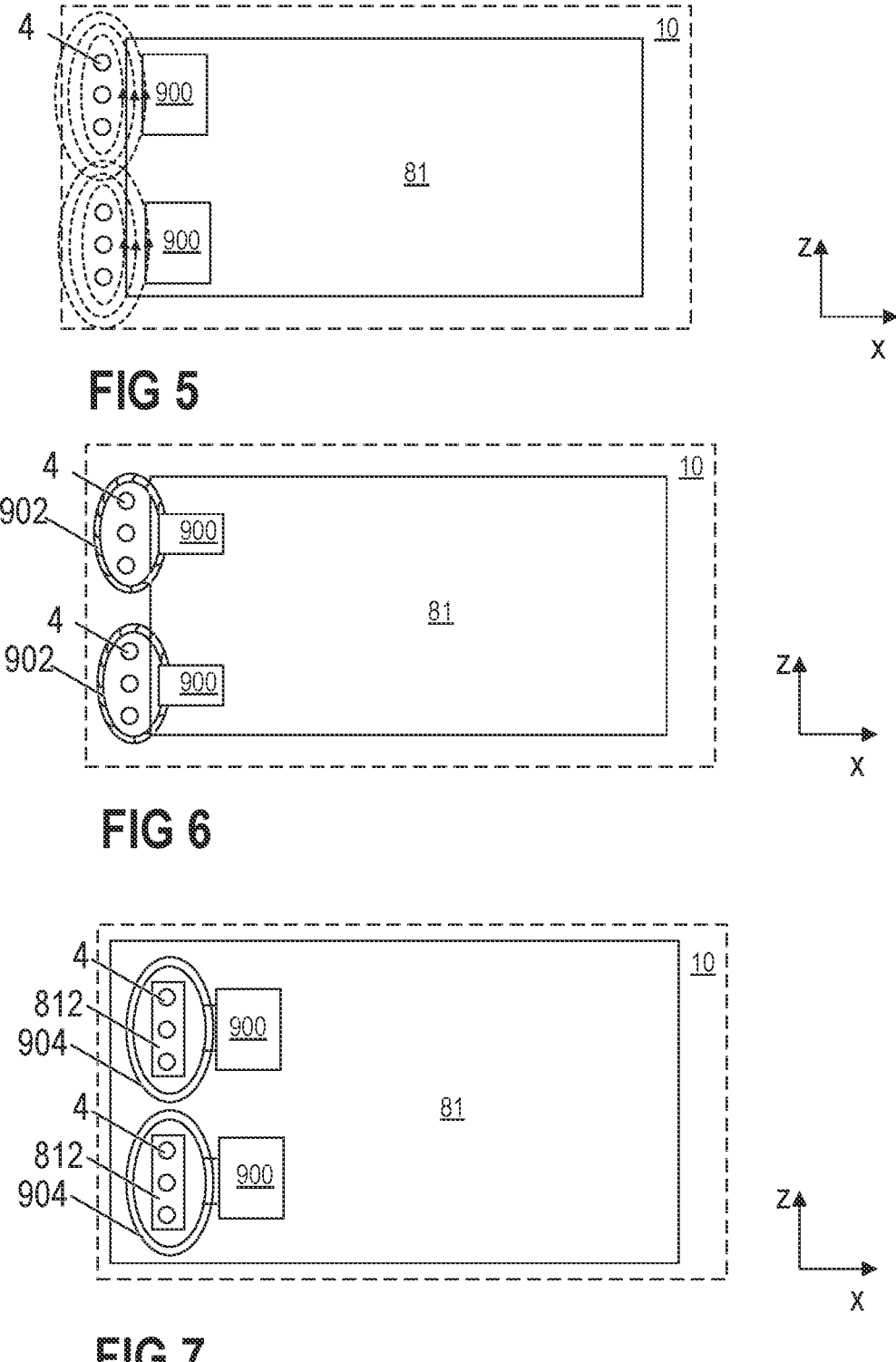
FIG. 5 is a top view of the power semiconductor module arrangement according to the example of FIG. 3.
FIG. 6 is a top view of the power semiconductor module arrangement according to the example of FIG. 4.
FIG. 7 is a top view of a power semiconductor module arrangement according to an even further example.

The arrangement of FIG. 3 is further illustrated in the schematic top view of FIG. 5. In the example of FIG. 5, the magnetic field caused by the current $I_S$ flowing through the one or more terminal elements 4 (three terminal elements for each magnetic field sensor 900 in the example of FIG. 5) is schematically illustrated by means of dashed lines extending around the terminal elements 4.

Figure 4:
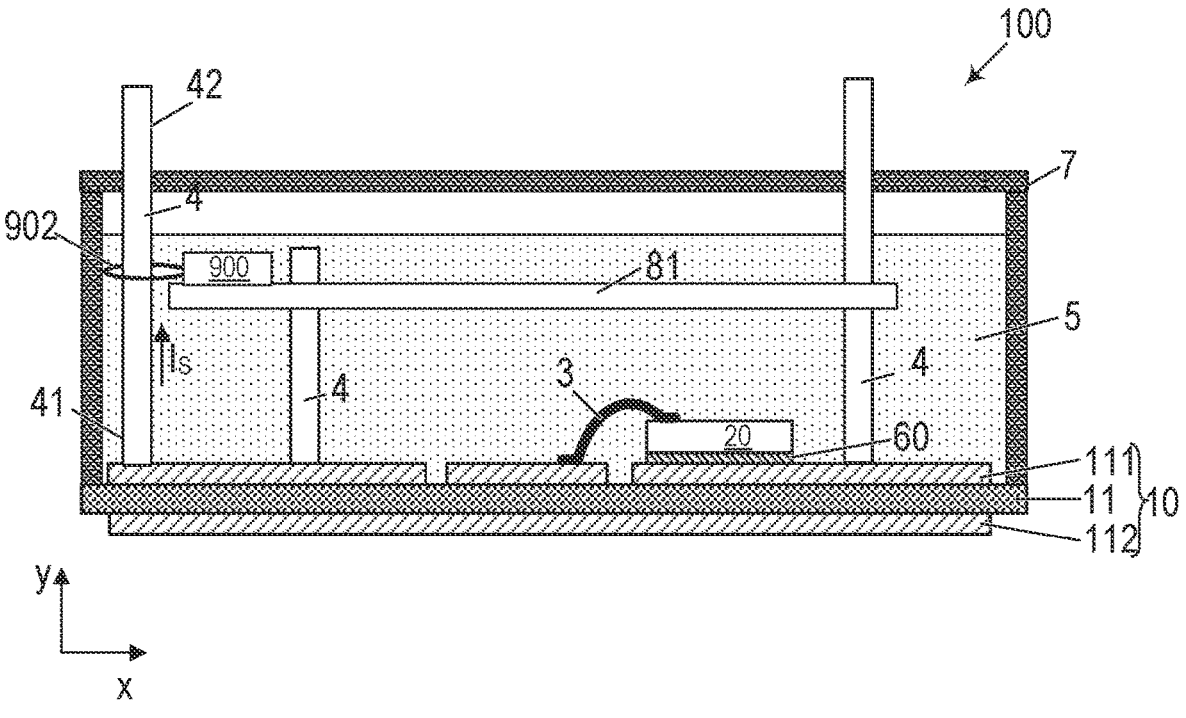
FIG. 4 is a cross-sectional view of a power semiconductor module arrangement according to another example.

According to another example, which is schematically illustrated in the cross-sectional view of FIG. 4 and the top view of FIG. 6, the magnetic field sensor 900 may be coupled to a magnetic core 902 which encircles the one or more terminal elements 4. The magnetic core 902 may comprise a magnetic material having a high magnetic permeability, e.g., a ferromagnetic material such as iron or ferrite. In this way, the magnetic field caused by the current $I_S$ flowing through the one or more terminal elements 4 is concentrated in the magnetic core 902 and may be increased, for example. The magnetic core 902 may comprise an air gap in which the magnetic field sensor 900 is arranged. This also allows to determine the strength of the magnetic field caused by the current $I_S$ through the terminal elements 4. In particular, the magnetic field is concentrated by the magnetic core 902 and guided to the air gap, where it may be reliably detected by the magnetic field sensor 900.

According to an even further example which is schematically illustrated in the top view of FIG. 7, the one or more terminal elements 4 extend through an opening 812 in the printed circuit board 81. The magnetic field sensor 900 is arranged on the printed circuit board 81 and is coupled to a coil or core 904 formed on the printed circuit board 81. The coil or core 904 may be formed by means of conducting paths formed on the printed circuit board 81, for example. The coil or core 904 encloses (extends around) the hole 812 formed in the printed circuit board 81. This also allows to determine the strength of the magnetic field caused by an alternating current $I_S$ through the terminal elements 4. The alternating current $I_S$ through the terminal elements 4 causes a variable magnetic field which, in turn, induces a current in the coil or core 904. This induced current can be determined by the magnetic field sensor 900 and allows to determine the current $I_S$ through the terminal elements 4.

Now referring to FIG. 9, an example of a dedicated electrically conducting component 910 that has no other function than conducting a current which causes a magnetic field to be detected by the magnetic field sensor 900 is described in further detail. FIG. 9 schematically illustrates a three-dimensional view of an electrically conducting component 910 without a magnetic field sensor 900 (left side of FIG. 9), and with a magnetic field sensor 900 (right side of FIG. 9). The substrate 10 and printed circuit board 81 are not explicitly illustrated in FIG. 9. The electrically conducting component 910 in this example comprises a bracket. The bracket may be formed of an electrically conducting material such as, e.g., a metal. The bracket 910 comprises two contact areas 9102, each of the two contact areas 9102 being configured to be electrically and mechanically coupled to the substrate 10 or to the printed circuit board 81. A connecting piece 9104 extends between and connects the two contact areas 9102. The connecting piece 9104 forms an arc or bridge that is arranged distant from the substrate 10 or the printed circuit board 81. The contact areas 9102 may be coupled to the first metal layer 111 of a substrate 10 or to conductor tracks formed on the printed circuit board 81, for example, such that a current may flow from a first one of the contact areas 9102 through the connecting piece 9104 to the second one of the contact areas 9102. The connecting piece 9104 may have a section that is essentially parallel to the substrate 10 and the printed circuit board 81. This allows a magnetic field sensor 900 to be placed at the required distance d1 from the connecting piece 9104 in order to be able to detect a magnetic field caused by the current flowing through the bracket 910.

The printed circuit board 81 usually is arranged at a certain distance from the substrate 10. This may have different reasons. For example, the different components arranged on the substrate 10 may be required to be arranged at a certain distance from the printed circuit board 81, to provide sufficient electric insulation. A magnetic field sensor 900 mounted to the printed circuit board 81, therefore, may be arranged comparably far away from the substrate 10. Therefore, a current flowing through, e.g., a section of the first metallic layer 111 of the substrate may not cause a magnetic field that is strong enough to be detected by the magnetic field sensor 900. As the connecting piece 9104 forms an arc or bridge, it extends at a certain distance from the substrate 10 and is arranged much closer to the magnetic field sensor 900 than the substrate 10 itself (or the metallization layer 111). A magnetic field that is caused by a current flowing through the connecting piece 9104, therefore, may be strong enough in order to be detected by the magnetic field sensor 900. The connecting piece 9104, therefore reduces the distance to the magnetic field sensor 900. A size of the bracket 910, therefore, may be chosen in order to match the overall dimensions of the power semiconductor module arrangement 100. This is further illustrated in the cross-sectional view of FIG. 10. The same applies when the bracket 910 is mounted to the printed circuit board 81, and the magnetic field sensor 900 is mounted to the substrate 10.

Figures 11, 12:
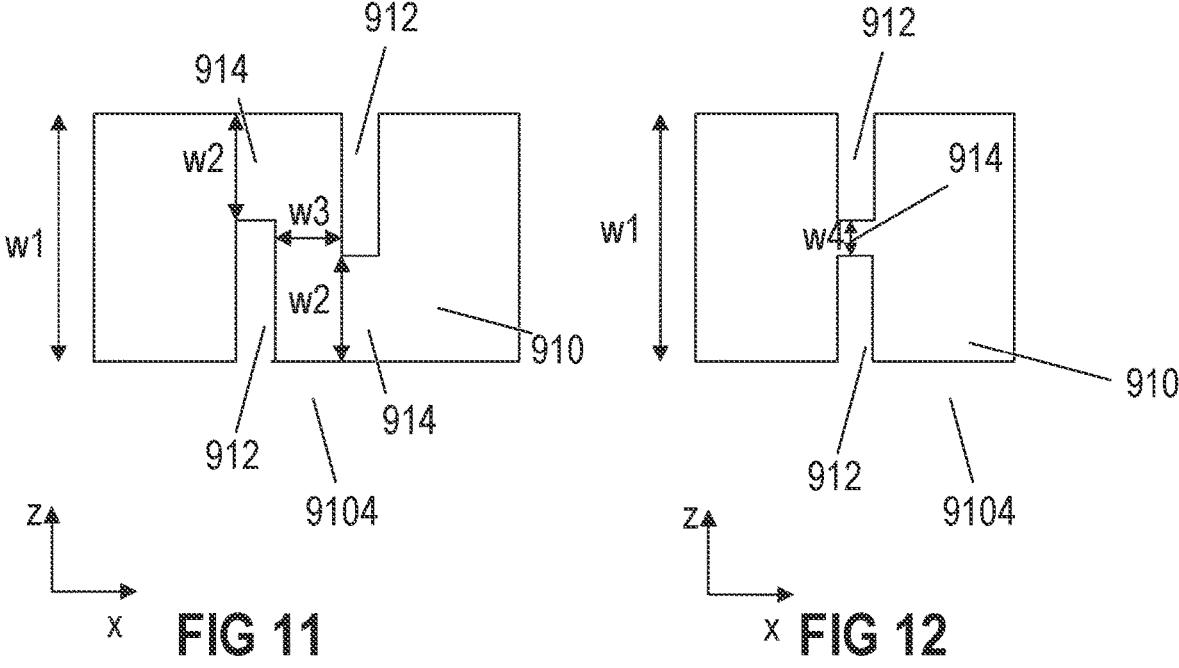
FIG. 11 schematically illustrates a top view of a metal bracket of a current measurement arrangement according to one example.
FIG. 12 schematically illustrates a top view of a metal bracket of a current measurement arrangement according to another example.

Now referring to FIGS. 11 and 12, the connecting piece 9104 may have a first width w1 in a horizontal direction z. This first width w1 may be locally reduced to a second width w2 which is smaller than the first width w1 in at least one section 914. In the example illustrated in FIG. 11, the connecting piece 9104 comprises two recesses 912. The recesses 912 extend into the connecting piece 9104 from opposite sides and are arranged offset to each other. In this way, the first width w1 is locally reduced to the second width w2 in two different sections 914. The connecting piece 9104, therefore, generally has an S-shape. A current flowing through the connecting piece 9104 has to flow through a middle section of the S, having a third width w3 in another horizontal direction x that may be even smaller than the second width w2. In this way, the resistance of the connecting piece 9104 is locally increased in those sections having a reduced width, thereby increasing the magnetic field caused by the current flowing through the connecting piece 9104. In the remaining sections of the bracket 910, however, the resulting magnetic field is comparably low. The magnetic field, therefore, is concentrated in the position close to the magnetic field sensor 900 where it is to be detected. Other components of the power semiconductor module arrangement 100, however, are not affected by the magnetic field caused by the current flowing through the bracket 910.

The same effect results in the example illustrated in FIG. 12. In this example, the two recesses 912 are not arranged offset to each other. The first width w1 of the connecting piece 9104, therefore, is only locally reduced in one section 914, having a fourth width w4 that is less than the first width w1. In this example, the connecting piece generally has the shape of an H.

The shapes illustrated in FIGS. 11 and 12, however, are only examples. A bracket 910 as has been described above may have any other shape which results in a magnetic field that is strong enough to be detected by the magnetic field sensor 900.

As can be seen from the above, the arrangement comprising an electrically conducting component 950 and a magnetic field sensor 900 can be implemented in a very simple and space saving way. It is even possible to use components to function as the electrically conducting component 950 that are already present in the power semiconductor module arrangement 100 for other reasons. The galvanic isolation between the electrically conducting component 950 and the magnetic field sensor 900 is provided by the distance between them and the encapsulant 5 which is already present in the power semiconductor module arrangement 100 for other reasons. That is, the galvanic isolation can be provided without any additional costs. Further, no bulky and expensive shunts are needed in the arrangement described above in order to detect a current in the power semiconductor module arrangement 100.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:
   a housing;
   a substrate comprising a substrate layer and a first metallization layer deposited on a first side of the substrate layer, and arranged inside the housing or forming a bottom of the housing;
   a printed circuit board arranged inside the housing, vertically above and in parallel to the substrate;
   a plurality of electrically conducting components arranged on the printed circuit board and on the substrate;
   an encapsulant at least partly filling the interior of the housing, thereby covering the substrate; and
   a magnetic field sensor,
   wherein either the magnetic field sensor is arranged on the substrate within range of a magnetic field caused by a current flowing through one of the electrically conducting components arranged on the printed circuit board, or the magnetic field sensor is arranged on the printed circuit board within range of a magnetic field caused by a current flowing through one of the electrically conducting components arranged on the substrate,
   wherein the magnetic field sensor is electrically insulated from the respective electrically conducting component.

2. The power semiconductor module arrangement of claim 1, wherein the electrically conducting component comprises a bracket.

3. The power semiconductor module arrangement of claim 2, wherein the bracket comprises two contact areas, each of the two contact areas being electrically and mechanically coupled to the substrate or the printed circuit board, and a connecting piece extending between and connecting the two contact areas, and forming an arc or bridge that is arranged distant from the substrate or the printed circuit board.

4. The power semiconductor module arrangement of claim 3, wherein the connecting piece has a first width in a horizontal direction that is locally reduced in at least one section.

5. The power semiconductor module arrangement of claim 1, wherein the magnetic field sensor comprises a Hall element.

6. The power semiconductor module arrangement of claim 1, wherein the electrically conducting component is a bonding wire, a bonding ribbon, a section of the first metallization layer of the substrate, or a conducting path formed on the printed circuit board.

7. The power semiconductor module arrangement of claim 1, wherein the electrically conducting component comprises one or more terminal elements extending from the substrate to the outside of the housing and configured to provide control signals to and from the power semiconductor module arrangement.

8. The power semiconductor module arrangement of claim 7, wherein the magnetic field sensor is arranged on the printed circuit board and is coupled to a coil or core formed on the printed circuit board.

9. The power semiconductor module arrangement of claim 8, wherein the coil or core encloses a hole formed in the printed circuit board, and wherein the one or more terminal elements extend from the substrate to the outside of the housing through the hole formed in the printed circuit board.

10. The power semiconductor module arrangement of claim 7, further comprising a magnetic core encircling the one or more terminal elements.

11. The power semiconductor module arrangement of claim 10, wherein the magnetic core comprises an air gap and the magnetic field sensor is arranged within the air gap.

12. A method, comprising:

arranging a substrate with a plurality of electronic or electrically conducting components arranged thereon in a housing or as a bottom of a housing, wherein the housing comprises sidewalls;

arranging a printed circuit board with a plurality of electronic or electrically conducting components arranged thereon in the housing, vertically above and in parallel to the substrate;

forming an encapsulant at least partly filling the interior of the housing, thereby covering the substrate; and arranging a magnetic field sensor either on the substrate within range of a magnetic field caused by a current flowing through one of the electrically conducting components arranged on the printed circuit board, or on the printed circuit board within range of a magnetic field caused by a current flowing through one of the electrically conducting components arranged on the substrate, wherein the magnetic field sensor is electrically insulated from the respective electrically conducting component.

\* \* \* \* \*